(12) United States Patent
Kim et al.

(10) Patent No.: US 8,587,357 B2
(45) Date of Patent: Nov. 19, 2013

(54) AC SUPPLY NOISE REDUCTION IN A 3D STACK WITH VOLTAGE SENSING AND CLOCK SHIFTING

(75) Inventors: Jae-Joon Kim, Yorktown Heights, NY (US); Yu-Shiang Lin, Elmsford, NY (US); Liang-Teck Pang, White Plains, NY (US); Joel A. Silberman, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 13/217,406

(22) Filed: Aug. 25, 2011

(65) Prior Publication Data

US 2013/0049828 A1 Feb. 28, 2013

(51) Int. Cl.
*H03K 5/00* (2006.01)
*H03K 3/00* (2006.01)

(52) U.S. Cl.
USPC .......................... 327/296; 327/292; 327/551

(58) Field of Classification Search
USPC ........... 327/551–559, 336–337, 34, 291–195, 327/291–296
See application file for complete search history.

(56) References Cited

U.S. PATENT DOCUMENTS

| | | |
|---|---|---|
| 4,868,712 A | 9/1989 | Woodman |
| 5,200,631 A | 4/1993 | Austin et al. |
| 5,280,184 A | 1/1994 | Jokerst et al. |
| 5,655,290 A | 8/1997 | Moresco et al. |
| 5,702,984 A | 12/1997 | Bertin et al. |
| 6,141,245 A | 10/2000 | Bertin et al. |
| 6,258,623 B1 | 7/2001 | Moden et al. |
| 6,569,762 B2 | 5/2003 | Kong |
| 6,982,869 B2 | 1/2006 | Larson |
| 7,021,520 B2 | 4/2006 | Bowen |
| 7,030,486 B1 | 4/2006 | Marshall |
| 7,067,910 B2 | 6/2006 | Drost et al. |
| 7,521,950 B2 | 4/2009 | Bernstein et al. |
| 7,615,869 B2 | 11/2009 | Koo et al. |

(Continued)

FOREIGN PATENT DOCUMENTS

FR 2946182 A1 12/2010

OTHER PUBLICATIONS

Badaroglu et al., "Clock-skew-optimization methodology for substrate-noise reduction with supply-current folding" ICCAD, vol. 25. No. 6, pp. 1146-1154, Jun. 2006.

(Continued)

*Primary Examiner* — Dinh T. Le
(74) *Attorney, Agent, or Firm* — Tutunjian & Bitetto, P.; Louis J. Percello

(57) ABSTRACT

There is provided an alternating current supply noise reducer for a 3D chip stack having two or more strata. Each of the strata has a respective one of a plurality of power distribution circuits and a respective one of a plurality of clock distribution circuits arranged thereon. The alternating current supply noise reducer includes a plurality of voltage droop sensors and a plurality of skew adjustors. The plurality of voltage droop sensors is for detecting alternating current supply noise in the plurality of power distribution circuits. One or more voltage droop sensors are respectively arranged on at least some of the strata. The plurality of skew adjusters are for delaying one or more clock signals provided by the plurality of clock distribution circuits responsive to an amount of the alternating current supply noise. Each skew adjuster is respectively arranged on the at least some of the strata.

25 Claims, 6 Drawing Sheets

(56) References Cited

U.S. PATENT DOCUMENTS

| | | | |
|---|---|---|---|
| 7,623,398 B2 | 11/2009 | Arai | |
| 7,629,827 B2 * | 12/2009 | Fukuoka et al. | 327/295 |
| 7,701,251 B1 | 4/2010 | Rahman et al. | |
| 7,710,329 B2 | 5/2010 | Chiozzi | |
| 7,753,779 B2 | 7/2010 | Shayesteh | |
| 7,768,790 B2 | 8/2010 | Kuroda et al. | |
| 7,772,708 B2 | 8/2010 | Leddige et al. | |
| 7,830,692 B2 | 11/2010 | Chung et al. | |
| 7,863,960 B2 * | 1/2011 | Wang et al. | 327/291 |
| 8,125,261 B2 * | 2/2012 | Nomura | 327/270 |
| 2002/0089831 A1 | 7/2002 | Forthun | |
| 2004/0177237 A1 | 9/2004 | Huppenthal et al. | |
| 2005/0058128 A1 | 3/2005 | Carson et al. | |
| 2006/0043598 A1 | 3/2006 | Kirby et al. | |
| 2007/0033562 A1 | 2/2007 | Correale et al. | |
| 2007/0047284 A1 | 3/2007 | Silvestri | |
| 2007/0132070 A1 | 6/2007 | Buot et al. | |
| 2007/0287224 A1 | 12/2007 | Alam et al. | |
| 2007/0290333 A1 | 12/2007 | Saini et al. | |
| 2008/0068039 A1 | 3/2008 | Bernstein et al. | |
| 2008/0204091 A1 | 8/2008 | Choo et al. | |
| 2009/0024789 A1 | 1/2009 | Rajan et al. | |
| 2009/0055789 A1 | 2/2009 | McIlrath | |
| 2009/0064058 A1 | 3/2009 | McIlrath | |
| 2009/0070549 A1 | 3/2009 | Solomon | |
| 2009/0070721 A1 | 3/2009 | Solomon | |
| 2009/0168860 A1 | 7/2009 | Magagni et al. | |
| 2009/0196312 A1 | 8/2009 | Kuroda | |
| 2009/0237970 A1 | 9/2009 | Chung | |
| 2009/0245445 A1 | 10/2009 | Saen et al. | |
| 2009/0323456 A1 | 12/2009 | Gomm | |
| 2010/0001379 A1 | 1/2010 | Lee et al. | |
| 2010/0005437 A1 | 1/2010 | McIlrath | |
| 2010/0044846 A1 | 2/2010 | Ohmi et al. | |
| 2010/0059869 A1 | 3/2010 | Kaskoun et al. | |
| 2010/0332193 A1 | 12/2010 | Hu et al. | |
| 2011/0016446 A1 | 1/2011 | Krebd | |
| 2011/0032130 A1 | 2/2011 | Ludwig | |
| 2011/0121811 A1 | 5/2011 | Dennard et al. | |

OTHER PUBLICATIONS

Chan et al., "A Resonant Global Clock Distribution for the Cell Broadband Engine Processor" IEEE J. Solid State Circuits, vol. 44, No. 1, pp. 64-72, Jan. 2009.

Gutnik et al., "Active GHz Clock Network Using Distributed PLLs" IEEE JSSC, vol. 35, No. 11, pp. 1553-1560, Nov. 2000.

Lam et al., "Power supply noise suppression via clock skew scheduling," in Proceedings of International Symposium on Quality Electronic Design, pp. 355-360, Mar. 2002.

Miura et al., "A 2.7Gb/s/mm2 0.9pj/b/Chip 1Coil/Channel ThruChip Interface with Coupled-Resonator-Based CDR for NAND Flash Memory Stacking," ISSCC, pp. 490-491, Feb. 2011.

Pavlidis et al., "Clock distribution networks for 3-D integrated Circuits", IEEE CICC, pp. 651-654, Sep. 2008.

Restle et al., "A Clock Distribution Method for Microprocessors", IEEE JSSC, vol. 36, No. 5, pp. 792-799, May 2001.

Tam et al., "Clock Generation and distribution for the first IA-64 Microprocessor", IEEE JSSC vol. 35, No. 11, pp. 1545-1552, Nov. 2000.

* cited by examiner

AC SUPPLY NOISE REDUCTION IN A 3D STACK WITH VOLTAGE SENSING AND CLOCK SHIFTING

CROSS-REFERENCE TO RELATED APPLICATIONS

This application is related to the following commonly assigned applications, all concurrently filed herewith and incorporated herein by reference: Ser. No. 13/217,734, entitled "PROGRAMMING THE BEHAVIOR OF INDIVIDUAL CHIPS OR STRATA IN A 3D STACK OF INTEGRATED CIRCUITS"; Ser. No. 13/217,335, entitled "SYNCHRONIZING GLOBAL CLOCKS IN 3D STACKS OF INTEGRATED CIRCUITS BY SHORTING THE CLOCK NETWORK"; Ser. No. 13/217,349, entitled "3D CHIP STACK SKEW REDUCTION WITH RESONANT CLOCK AND INDUCTIVE COUPLING"; Ser. No. 13/217,767, entitled "3D INTEGRATED CIRCUIT STACK-WIDE SYNCHRONIZATION CIRCUIT"; Ser. No. 13/217,789, entitled "CONFIGURATION OF CONNECTIONS IN A 3D STACK OF INTEGRATED CIRCUITS"; Ser. No. 13/217,381, entitled "3D INTER-STRATUM CONNECTIVITY ROBUSTNESS"; Ser. No. 13/217,429, entitled "VERTICAL POWER BUDGETING AND SHIFTING FOR 3D INTEGRATION".

BACKGROUND

1. Technical Field

The present invention relates generally to integrated circuits and, in particular, to alternating current (AC) supply noise reduction in a 3D stack with voltage sensing and clock shifting.

2. Description of the Related Art

Supply noise is spatially dependent on the current sources that are used. In general, simultaneous clock switching in synchronous clock systems causes large power supply noise through the power and ground power grids. Such synchronous clock systems may be used, for example, in 3D stacked chips.

Three-dimensional (3D) stacked chips include two or more electronic integrated circuit chips stacked one on top of the other. The chips are connected to each other with chip-to-chip interconnects that could use C4 or other technology, and the chips could include through-Silicon vias (TSVs) to connect from the front side to the back side of the chip. Given the amount of simultaneous clock switching that typically occurs in 3D chips, the reduction of AC noise in 3D chips is particularly of interest.

SUMMARY

According to an aspect of the present principles, there is provided an alternating current supply noise reducer for a 3D chip stack having two or more strata. Each of the two or more strata has a respective one of a plurality of power distribution circuits and a respective one of a plurality of clock distribution circuits arranged thereon. The alternating current supply noise reducer includes a plurality of voltage droop sensors and a plurality of skew adjustors. The plurality of voltage droop sensors is for detecting alternating current supply noise in the plurality of power distribution circuits. One or more of the plurality of voltage droop sensors are respectively arranged on at least some of the two or more strata. The plurality of skew adjusters are for delaying one or more clock signals provided by the plurality of clock distribution circuits responsive to an amount of the alternating current supply noise. Each of the plurality of skew adjusters is respectively arranged on the at least some of the two or more strata.

According to another aspect of the present principles, there is provided a method for reducing alternating current supply noise in a 3D chip stack having two or more strata. Each of the two or more strata has a respective one of a plurality of power distribution circuits and a respective one of a plurality of clock distribution circuits arranged thereon. The method includes respectively arranging one or more of a plurality of voltage droop sensors on at least some of the two or more strata to detect alternating current supply noise in the plurality of power distribution circuits. The method further includes respectively arranging each of a plurality of skew adjusters on the at least some of the two or more strata to delay one or more clock signals provided by the plurality of clock distribution networks responsive to an amount of the alternating current supply noise.

According to yet another aspect of the present principles, there is provided a 3D chip stack having two or more strata. The 3D chip stack includes a plurality of power distribution circuits, each being arranged on a respective one of the two or more strata for providing power signals to various locations thereon. The 3D chip stack further includes a plurality of clock distribution circuits, each being arranged on the respective one of the two or more strata for providing clock signals to particular locations thereon. The 3D chip stack also includes a plurality of voltage droop sensors, one or more being respectively arranged on at least some of the two or more strata for detecting alternating current supply noise in the power signals. The 3D chip stack additionally includes a plurality of skew adjusters, each being respectively arranged on the at least some of the two or more strata for delaying one or more of the clock signals responsive to an amount of the alternating current supply noise.

According to still another aspect of the present principles, there is provided a method for providing a 3D chip stack having two or more strata with reduced alternating current supply noise. The method includes arranging each of a plurality of power distribution circuits on a respective one of the two or more strata to provide power signals to various locations thereon. The method further includes arranging each of a plurality of clock distribution circuits on the respective one of the two or more strata to provide clock signals to particular locations thereon. The method also includes respectively arranging one or more of a plurality of voltage droop sensors on at least some of the two or more strata to detect alternating current supply noise in the power signals. The method additionally includes respectively arranging each of a plurality of skew adjusters on the at least some of the two or more strata to delay one or more of the clock signals responsive to an amount of the alternating current supply noise.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to alternating current (AC) supply noise reduction in a 3D stack with voltage sensing and clock shifting. In an embodiment, the present principles provide a way to skew the clock phases between the top and bottom chips in a chip stack to reduce AC supply noise. Moreover, in an embodiment, voltage droop detection and clock phase shifting are combined to minimize noise for a given stratum in a stack. Advantageously, the present principles allow a designer to factor in the clock uncertainty between 3D strata into the optimization of skew scheduling.

Figure 1:
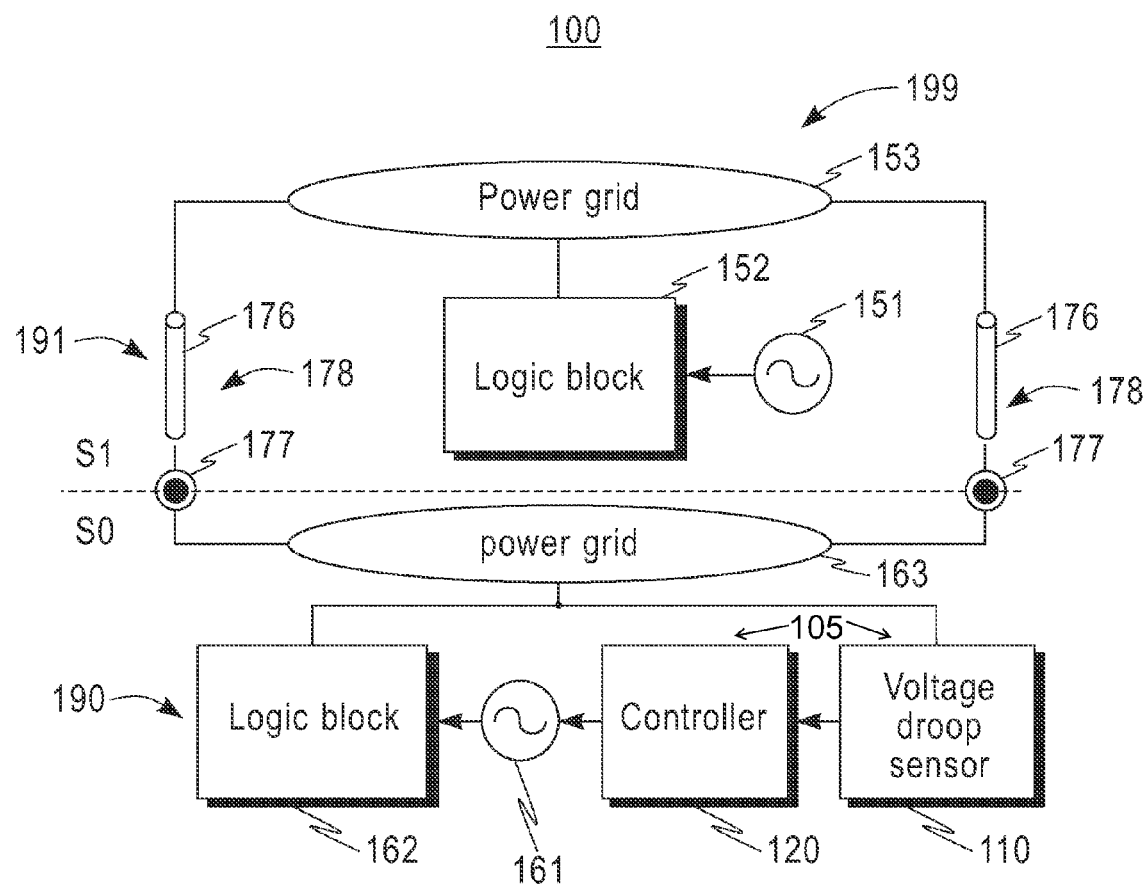
FIG. 1 shows an AC supply noise reducing architecture 100 with voltage sensing and clock shifting for a 3D chip stack 199, in accordance with an embodiment of the present principles.

FIG. 1 shows an AC supply noise reducing architecture 100 with voltage sensing and clock shifting for a 3D chip stack 199, in accordance with an embodiment of the present principles. The AC supply noise reducing architecture 100 provides for AC supply noise detection and AC supply noise reduction on a same stratum (S0 190) on which a corresponding AC supply noise reducer 105 is located.

The chip stack 199 includes some power and clock circuitry. Advantageously, the present principles can operate along with the existing power and clock circuitry in order to reduce the AC supply noise. Thus, in the example of FIG. 1, a stratum S1 191 of the chip stack 199 includes a clock source 151 connected to a logic block 152 that, in turn, is connected to a power grid 153. A stratum S0 190 of the chip stack 199 includes a clock source 161 connected to a logic block 162 that, in turn, is connected to a power grid 163. The logic blocks 152 and 162 can include combinational circuits and so forth as typically found on a chip. Such logic blocks may perform functions including, but is not limited to, clock switching and so forth, as readily recognized by one of ordinary skill in this and related arts.

We note that the power grids 153 and 163 are interconnected between the strata using, for example, chip-to-chip interconnects 178. Such chip-to-chip interconnects 178 may include, but are not limited to, C4 micro bumps 177 and through-Silicon vias (TSVs) 176.

The AC supply noise reducer architecture 100 includes an AC supply noise reducer 105 having a voltage droop sensor 110 and a controller 120. The voltage droop sensor 110 is connected to the controller 120, the power grid 163, and the logic block 162. The controller 120 is also connected to the clock source 161.

The voltage droop sensor 110, located on stratum S0 190, detects AC power supply voltage noise. The detected AC supply noise is used to shift the clock phase on stratum S0 190. In particular, the controller 120 uses information pertaining to the detected AC supply noise including, but not limited to, an amplitude of the AC supply noise, to skew a clock signal provided by the clock source 161 by shifting a phase of that clock signal and/or otherwise delaying that clock signal. Advantageously, such skewing of the clock signal is performed so that peak power is drawn by different strata of the chip stack 199 at different times.

Figure 2:
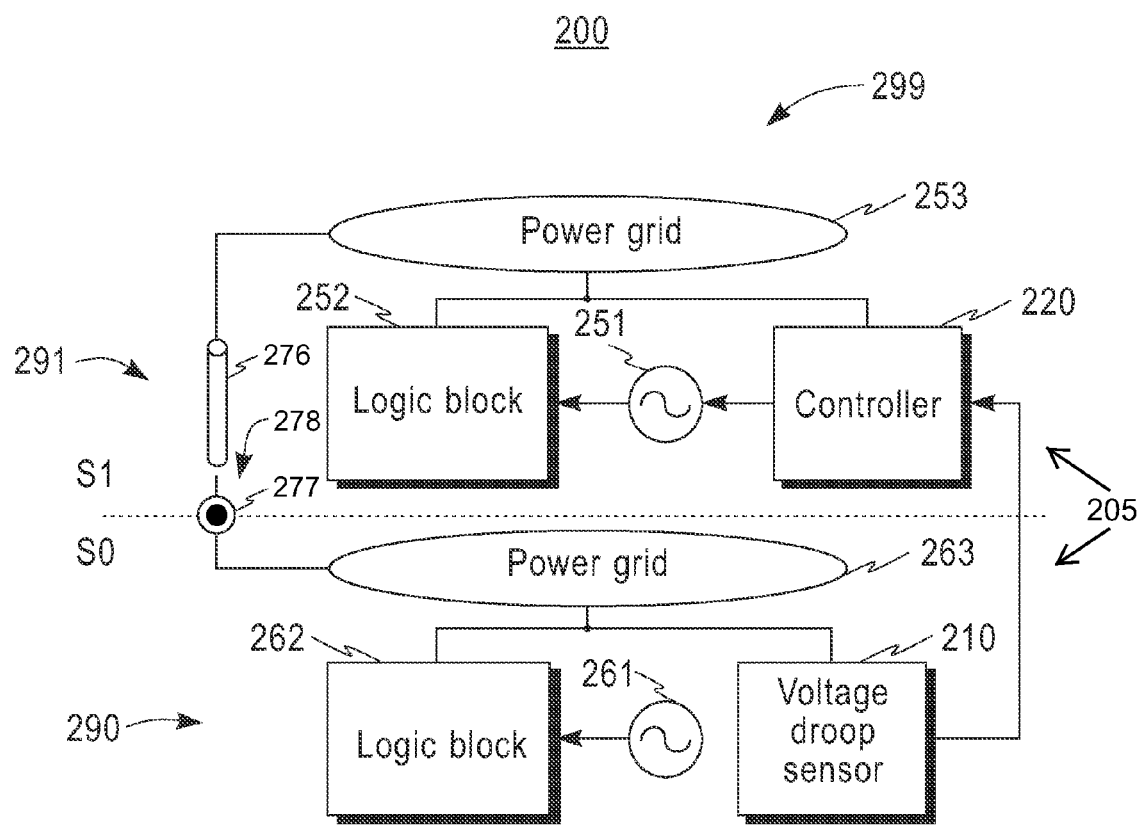
FIG. 2 shows another AC supply noise reducing architecture 200 with voltage sensing and clock shifting for a 3D chip stack 299, in accordance with an embodiment of the present principles.

FIG. 2 shows another AC supply noise reducing architecture 200 with voltage sensing and clock shifting for a 3D chip stack 299, in accordance with an embodiment of the present principles. The AC supply noise reducing architecture 200 provides for AC supply noise reduction on a different stratum (S1 291) than the stratum (S0 290) on which AC supply noise detection is provided, both the AC supply noise detection and the AC supply noise reduction provided by a corresponding AC supply noise reducer 205.

The chip stack 299 includes some power and clock circuitry. Advantageously, the present principles can operate along with the existing power and clock circuitry in order to reduce the AC supply noise. Thus, in the example of FIG. 2, a stratum S1 291 of the chip stack 299 includes a clock source 251 connected to a logic block 252 that, in turn, is connected to a power grid 253. A stratum S0 290 of the chip stack 299 includes a clock source 261 connected to a logic block 262 that, in turn, is connected to a power grid 263. The logic blocks 252 and 262 can include combinational circuits and so forth as typically found on a chip. Such logic blocks may perform functions including, but is not limited to, clock switching and so forth, as readily recognized by one of ordinary skill in this and related arts.

We note that the power grids 253 and 263 are interconnected between the strata using, for example, chip-to-chip interconnects 278. Such chip-to-chip interconnects 278 may include, but are not limited to, C4 micro bumps 277 and through-Silicon vias (TSVs) 276.

The AC supply noise reducer architecture 200 includes an AC supply noise reducer 205 having a voltage droop sensor 210 and a controller 220. The voltage droop sensor 210 is connected to the controller 220, the power grid 263, and the logic block 262. The controller 220 is also connected to the clock source 251.

The voltage droop sensor 210, located on stratum S0 290, detects AC power supply voltage noise. The detected AC supply noise is used to shift the clock phase on stratum S1 291. In particular, the controller 220 uses information pertaining to the detected AC supply noise including, but not limited to, an amplitude of the AC supply noise, to skew a clock signal provided by the clock source 251 by shifting a phase of that clock signal and/or otherwise delaying that clock signal. Advantageously, such skewing of the clock signal is performed so that peak power is drawn by different strata of the chip stack 299 at different times.

Figure 3:
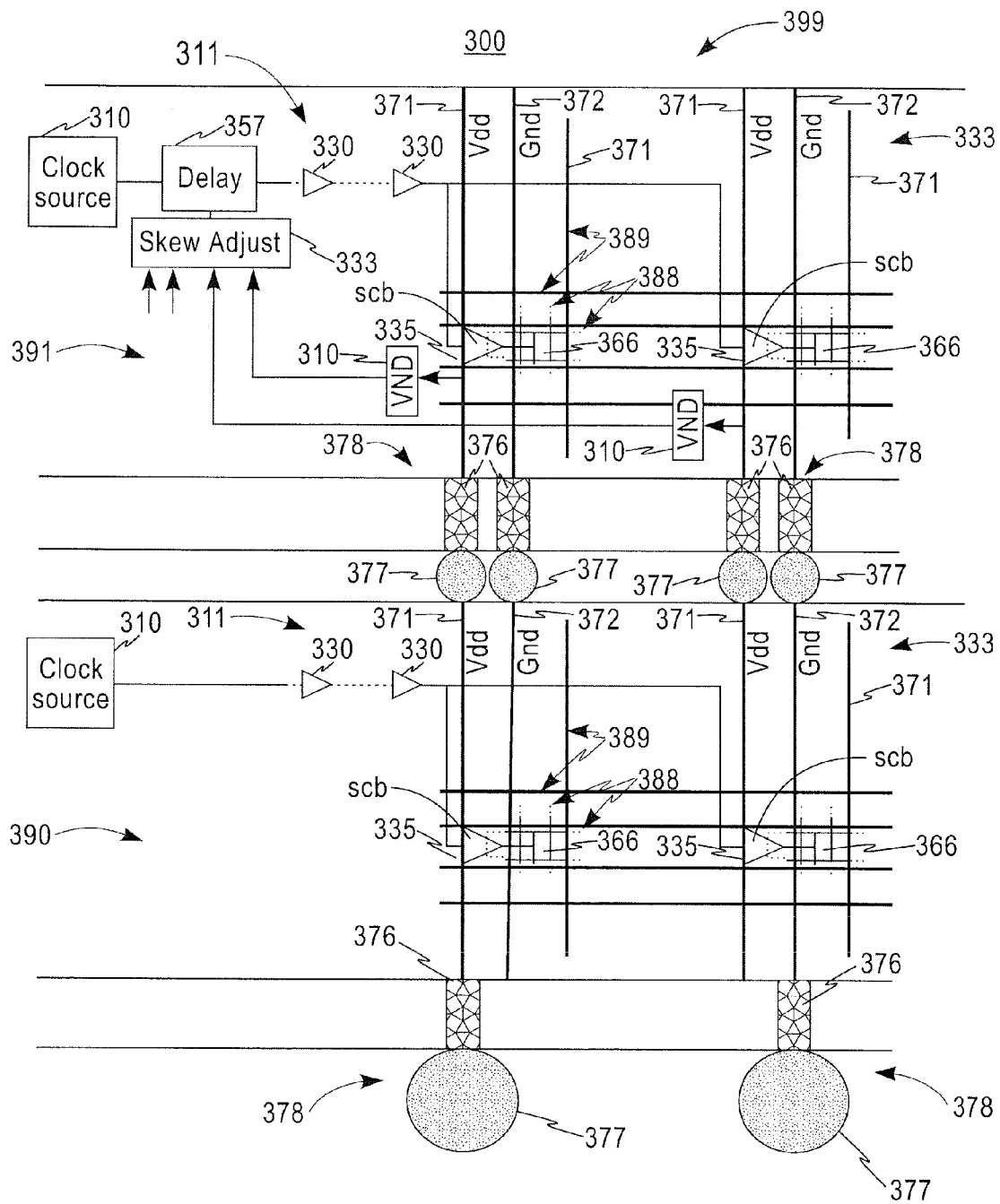
FIG. 3 shows an AC supply noise reducer 300 with voltage sensing and clock shifting for a 3D chip stack 399 having two strata, in accordance with an embodiment of the present principles.
Figure 4A:
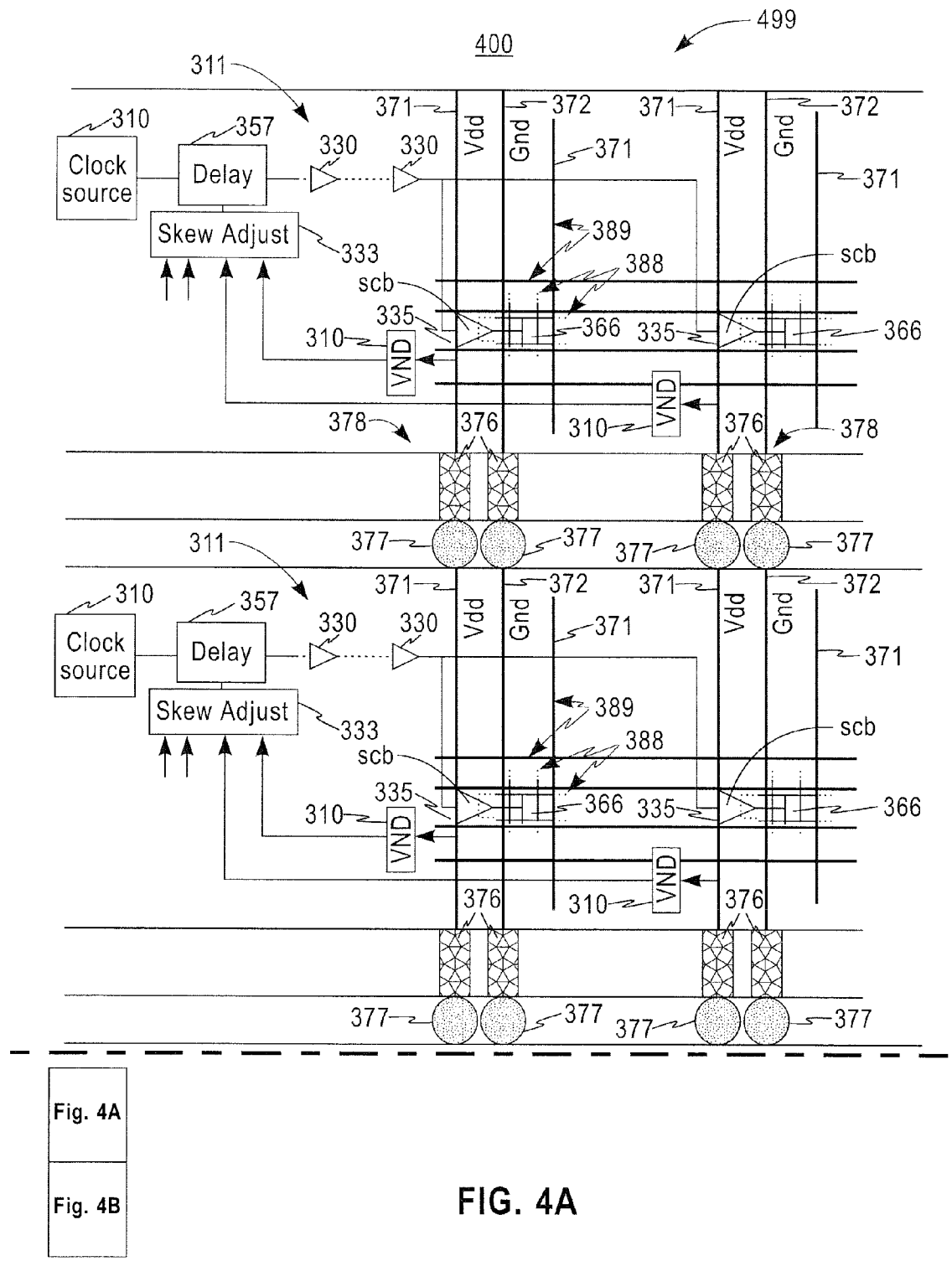
FIG. 4 shows an AC supply noise reducer 400 with voltage sensing and clock shifting for a 3D chip stack 499 having three strata, in accordance with an embodiment of the present principles.
Figure 4B:
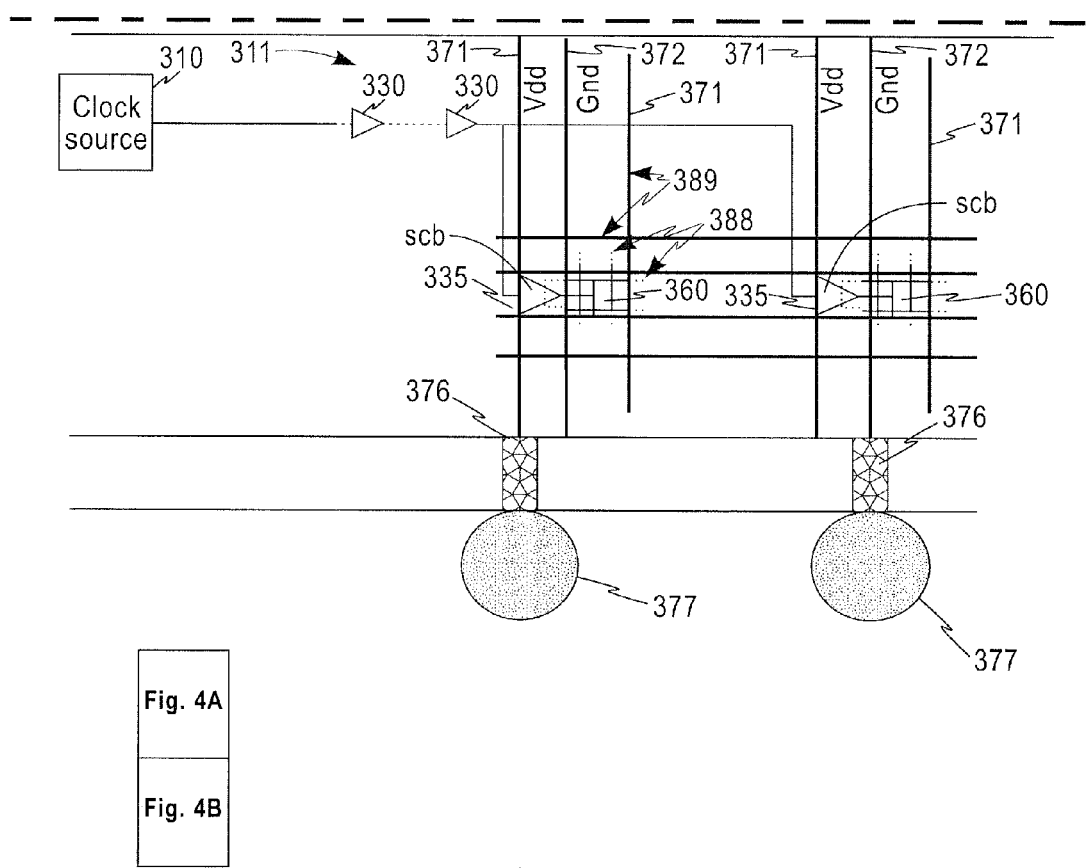

FIGS. 3 and 4 below show more detailed implementations involving power and clock grids on a 3D chip stack.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It is to be further appreciated that while one or more embodiments described herein may refer to the use of Silicon with respect to a chip or a through via, the present principles are not limited to using only chips or vias made from Silicon and, thus, chips or vias made from other materials including but not limited to Germanium and Gallium Arsenide may also be used in accordance with the present principles while maintaining the spirit of the present principles. Moreover, it is to be further appreciated that while one or more embodiments described herein may refer to the use of C4 or micro C4 (uC4) connections, the present principles are not limited to solely using C4 or micro C4 connections and, thus, other types of connections may also be used while maintaining the spirit of the present principles.

It is to be understood that the present invention will be described in terms of a given illustrative architecture having a wafer; however, other architectures, structures, substrate materials and process features and steps may be varied within the scope of the present invention.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

FIG. 3 shows an AC supply noise reducer 300 with voltage sensing and clock shifting for a 3D chip stack 399 having two strata, in accordance with an embodiment of the present principles.

The chip stack 399 includes a stratum-0 390 and a stratum-1 391. A clock distribution circuit 333 is provided on each stratum. The clock distribution circuit 333 provided on each stratum includes a respective delay portion 311 connected to a respective clock grid 388.

Each of the respective delay portions 311 on each of the strata is driven by a single clock source 310 (e.g., a phase locked loop (PLL)). Each of the respective delay portions 311, in turn, drive a respective clock grid 388. Each delay portion 311 includes clock buffers 330 and sector clock buffers (SCBs) 335. We note that sector clock buffers 335 are primarily used to drive respective clock grids 388 or one or more sectors 366 therein, while the clock buffers 330 are primarily used to buffer (delay) the clock signal.

Each of the strata includes a respective power grid 389 that includes voltage supply lines 371 and ground lines 372. The voltage supply lines 371 and ground lines 372 are connected through the strata using, for example, chip-to-chip interconnects 378. Such chip-to-chip interconnects 378 may include, but are not limited to, micro C4 connections 377 and through-Silicon vias (TSVs) 376.

A Vdd noise detector (VND) 310 detects voltage noise in the Vdd supply and sends the noise amplitude to a skew adjuster 333. There can be one or more VNDs 310 on each stratum. For example, the VNDs may be arranged uniformly over each stratum. In an embodiment, one VND is used per clock sector. Of course, other arrangements are possible, while maintaining the spirit of the present principles.

Dissimilar clock loads and different chip areas in each stratum will cause the skew to increase due to such variations. The skew adjustor 333 is capable of adjusting skew by providing a delay 357 to one or more clock signals. Such skew adjustment will delay the clock signal and adjust the skew within an acceptable range until a minimum amount of Vdd noise is detected.

FIG. 4 shows an AC supply noise reducer 400 with voltage sensing and clock shifting for a chip stack 499 having three strata, in accordance with an embodiment of the present principles. While the chip stack 499 shown in FIG. 4 includes three strata, given the teachings of the present principles provided herein, one of ordinary skill in this and related arts will readily appreciate that the present principles are readily applied to stacks that include more than three strata (as well as less, e.g., as in FIG. 3) while maintaining the spirit of the present principles. In an embodiment involving a stack with more than two strata, such as stack 499, the delay can be adjusted one stratum at a time.

Stack 499 includes a stratum-0 490, a stratum-1 491, and a stratum-2 492. The configurations of stratum-0 490 and stratum-1 491 in stack 499 are similar to the configurations of stratum-0 390 and stratum-1 391, respectively, in stack 399. However, stack 499 includes one additional stratum, namely stratum-2 492, which has a similar configuration to stratum-0 390 in stack 399.

Figure 5:
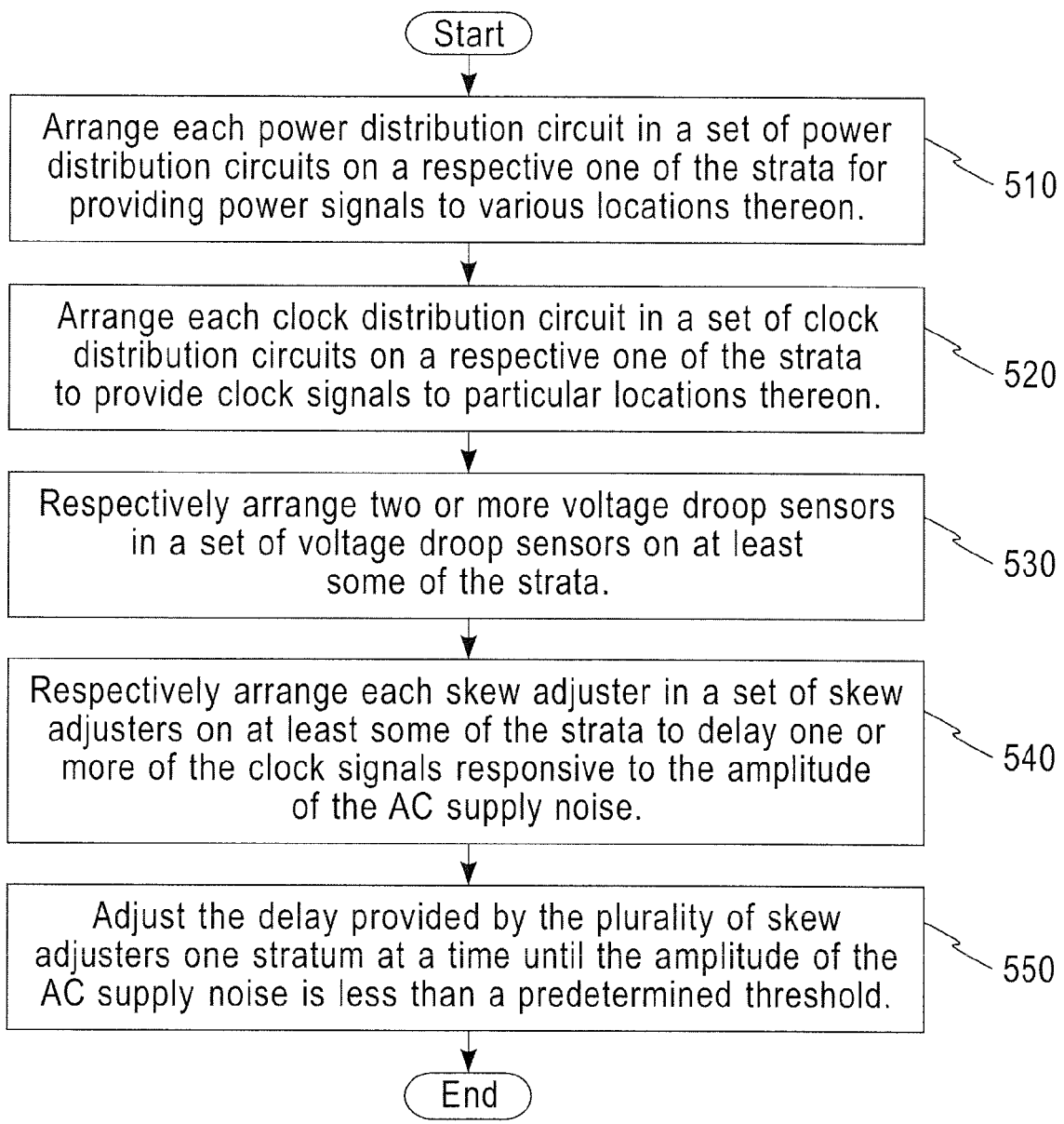
FIG. 5 shows a method 500 for reducing AC supply noise in a 3D chip stack having three strata, in accordance with an embodiment of the present principles.

FIG. 5 shows a method 500 for reducing AC supply noise in a chip stack having three strata, in accordance with an embodiment of the present principles. While method 500 is described with respect to a chip 3D stack having three strata, given the teachings of the present principles provided herein, one of ordinary skill in this and related arts will readily appreciate that methods in accordance with the present principles are readily applied to stacks that include more than three strata (as well as less, e.g., as in FIG. 3) while maintaining the spirit of the present principles.

At step 510, each power distribution circuit in a set of power distribution circuits is arranged on a respective one of the three or more strata for providing power signals to various locations thereon.

At step 520, each clock distribution circuit in a set of clock distribution circuits is arranged on a respective one of the three or more strata to provide clock signals to particular locations thereon.

At step 530, two or more voltage droop sensors in a set of voltage droop sensors are respectively arranged in a uniform configuration on at least some of the three or more strata to detect alternating current supply noise. In an embodiment, such detected alternating current supply noise is detected and averaged over an entire stratum by the respective noise reduction circuitry (e.g., VNDs and skew adjusters) on that stratum (see, e.g., FIG. 1) or on another stratum (see, e.g., FIG. 2). In another embodiment, such detected alternating current supply noise is detected with respect to one or more specific areas or components on a particular stratum. Moreover, a weighted average could be used. The latter embodiment is particularly suitable for areas or components that are critical for timing and/or are more susceptible to noise.

At step 540, each skew adjuster in a set of skew adjusters is respectively arranged on at least some of the three or more strata to delay one or more of the clock signals responsive to the amplitude of the alternating current supply noise.

At step 550, the delay provided by the plurality of skew adjusters is adjusted one stratum at a time until the amplitude of the alternating current supply noise is less than a predetermined threshold.

Some of the advantages provided by the present principles include, but are not limited to, the following. For example, the present principles do not require an inter-stratum signal. Moreover, the clock uncertainty due to die-to-die variation is taken into account. Further, the present principles do not require changes to the existing clock distribution topology since phase shifting only applied to the source of the clock.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An alternating current supply noise reducer for a 3D chip stack having two or more strata, each of the two or more strata having a respective one of a plurality of power distribution circuits and a respective one of a plurality of clock distribution circuits arranged thereon, the alternating current supply noise reducer comprising:
   a plurality of voltage droop sensors for detecting alternating current supply noise in the plurality of power distribution circuits, one or more of the plurality of voltage droop sensors being respectively arranged on at least some of the two or more strata; and
   a plurality of skew adjusters for delaying one or more clock signals provided by the plurality of clock distribution circuits responsive to an amount of the alternating current supply noise, each of the plurality of skew adjusters being respectively arranged on the at least some of the two or more strata.

2. The alternating current supply noise reducer of claim 1, wherein the amount is represented by an amplitude of the alternating current supply noise.

3. The alternating current supply noise reducer of claim 1, wherein each of the plurality of voltage droop sensors determines an average amount of the alternating current supply noise over a respective one of the two or more strata.

4. The alternating current supply noise reducer of claim 1, wherein a delay provided by the plurality of skew adjusters is adjusted one stratum at a time when the two or more strata comprise at least three strata.

5. The alternating current supply noise reducer of claim 1, wherein a delay provided by at least one of the plurality of skew adjusters on a given one of the two or more strata is adjusted until the amount of the alternating current supply noise on the given one of the two or more strata is below a predetermined threshold.

6. The alternating current supply noise reducer of claim 1, wherein each of the plurality of clock distribution circuits comprises a power grid having a plurality of sectors, and wherein each of the plurality of voltage droop sensors is located within or proximate to a respective one of the plurality of sectors in the at least some of the two or more strata.

7. The alternating current supply noise reducer of claim 1, wherein at least one of the plurality of voltage droop sensors and at least one of the plurality of skew adjusters, both located on a same one of the two or more strata, are used to respectively detect the alternating current supply noise on a different one of the two or more strata and to delay the one or more clock signals on the different one of the two or more strata.

8. A method for reducing alternating current supply noise in a 3D chip stack having two or more strata, each of the two or more strata having a respective one of a plurality of power distribution circuits and a respective one of a plurality of clock distribution circuits arranged thereon, the method comprising:
   respectively arranging one or more of a plurality of voltage droop sensors on at least some of the two or more strata to detect alternating current supply noise in the plurality of power distribution circuits; and
   respectively arranging each of a plurality of skew adjusters on the at least some of the two or more strata to delay one or more clock signals provided by the plurality of clock distribution networks responsive to an amount of the alternating current supply noise.

9. The method of claim 8, wherein the amount is represented by an amplitude of the alternating current supply noise.

10. The method of claim 8, wherein each of the plurality of voltage droop sensors determines an average amount of the alternating current supply noise over a respective one of the two or more strata.

11. The method of claim 8, further comprising adjusting a delay provided by the plurality of skew adjusters one stratum at a time when the two or more strata comprise at least three strata.

12. The method of claim 8, further comprising adjusting a delay provided by at least one of the plurality of skew adjusters on a given one of the two or more strata until the amount of the alternating current supply noise on the given one of the two or more strata is below a predetermined threshold.

13. The method of claim 8, wherein each of the plurality of clock distribution circuits comprises a power grid having a plurality of sectors, and wherein each of the plurality of voltage droop sensors is located within or proximate to a respective one of the plurality of sectors in the at least some of the two or more strata.

14. The method of claim 8, wherein at least one of the plurality of voltage droop sensors and at least one of the plurality of skew adjusters, both located on a same one of the two or more strata, are used to respectively detect the alternating current supply noise on a different one of the two or more strata and to delay the one or more clock signals on the different one of the two or more strata.

15. A 3D chip stack having two or more strata, the chip stack comprising:
- a plurality of power distribution circuits, each being arranged on a respective one of the two or more strata for providing power signals to various locations thereon;
- a plurality of clock distribution circuits, each being arranged on the respective one of the two or more strata for providing clock signals to particular locations thereon;
- a plurality of voltage droop sensors, one or more being respectively arranged on at least some of the two or more strata for detecting alternating current supply noise in the power signals; and
- a plurality of skew adjusters, each being respectively arranged on the at least some of the two or more strata for delaying one or more of the clock signals responsive to an amount of the alternating current supply noise.

16. The 3D chip stack of claim 15, wherein the amount is represented by an amplitude of the alternating current supply noise.

17. The 3D chip stack of claim 15, wherein each of the plurality of voltage droop sensors determines an average amount of the alternating current supply noise over a respective one of the two or more strata.

18. The 3D chip stack of claim 15, wherein each of the plurality of clock distribution circuits comprises a respective clock grid and a plurality of clock buffers.

19. The 3D chip stack of claim 18, wherein each of the plurality of clock buffers comprise a sector clock buffer for driving the respective clock grid on a same one of the two or more strata and a plurality of clock relay buffers.

20. The 3D chip stack of claim 15, wherein each of the plurality of power distribution circuits comprise a respective one of a plurality of power grids for providing the power signals to the various locations thereon.

21. The 3D chip stack of claim 15, wherein a delay provided by the plurality of skew adjusters is adjusted one stratum at a time when the two or more strata comprise at least three strata.

22. The 3D chip stack of claim 15, wherein the plurality of skew adjusters provides a delay to adjust a skew of the one or more clock signals until the amount of the alternating current supply noise is below a predetermined threshold.

23. The 3D chip stack of claim 15, wherein each of the plurality of clock distribution circuits comprise a plurality of sectors, each of the plurality of sectors driven by a sector clock buffer.

24. The 3D chip stack of claim 15, wherein each of the plurality of voltage droop sensors is respectively arranged within or adjacent to a respective one of the plurality of sectors.

25. A method for providing a 3D chip stack having two or more strata with reduced alternating current supply noise, the method comprising:
- arranging each of a plurality of power distribution circuits on a respective one of the two or more strata to provide power signals to various locations thereon;
- arranging each of a plurality of clock distribution circuits on the respective one of the two or more strata to provide clock signals to particular locations thereon;
- respectively arranging one or more of a plurality of voltage droop sensors on at least some of the two or more strata to detect alternating current supply noise in the power signals; and
- respectively arranging each of a plurality of skew adjusters on the at least some of the two or more strata to delay one or more of the clock signals responsive to an amount of the alternating current supply noise.

* * * * *